United States Patent
Kaiser et al.

(10) Patent No.: US 6,804,166 B2
(45) Date of Patent: Oct. 12, 2004

(54) METHOD AND APPARATUS FOR OPERATING A SEMICONDUCTOR MEMORY AT DOUBLE DATA TRANSFER RATE

(75) Inventors: Robert Kaiser, Kaufering (DE); Helmut Schneider, München (DE); Florian Schamberger, Bad Reichenhall (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/680,773

(22) Filed: Oct. 7, 2003

(65) Prior Publication Data

US 2004/0066701 A1 Apr. 8, 2004

Related U.S. Application Data

(63) Continuation of application No. PCT/EP02/02056, filed on Feb. 27, 2002.

(30) Foreign Application Priority Data

Apr. 7, 2001 (DE) .......................................... 101 17 614

(51) Int. Cl.$^7$ ................................................ G11C 8/00
(52) U.S. Cl. ............. 365/233; 365/189.01; 365/189.02; 365/230.03
(58) Field of Search ........................ 365/189.01, 189.02, 365/221, 230.03, 233

(56) References Cited

U.S. PATENT DOCUMENTS

| 4,849,937 | A | | 7/1989 | Yoshimoto |
| 6,016,283 | A | | 1/2000 | Jeong |
| 6,438,066 | B1 | * | 8/2002 | Ooishi et al. ................ 365/233 |
| 6,487,140 | B2 | * | 11/2002 | Tomaiuolo et al. ......... 365/233 |

FOREIGN PATENT DOCUMENTS

| JP | 61066441 A | * | 4/1986 | ........... H04L/13/08 |

OTHER PUBLICATIONS

Haberland, M.: "Synchrone laufen schneller" [Synchrons Operate Faster], *Elektronik*, vol. 19, 1995, pp. 118, 119.

* cited by examiner

Primary Examiner—Van Thu Nguyen
(74) Attorney, Agent, or Firm—Laurence A. Greenberg; Werner H. Stemer; Ralph E. Locher

(57) ABSTRACT

A data read access and a data write access is shared between two memory banks. A first memory bank of which is operated with a clock that is shifted by half a clock pulse with respect to the operating clock of the other, second memory bank. Partial data streams are combined at the output of the two memory banks to form a data stream with double the frequency.

3 Claims, 1 Drawing Sheet

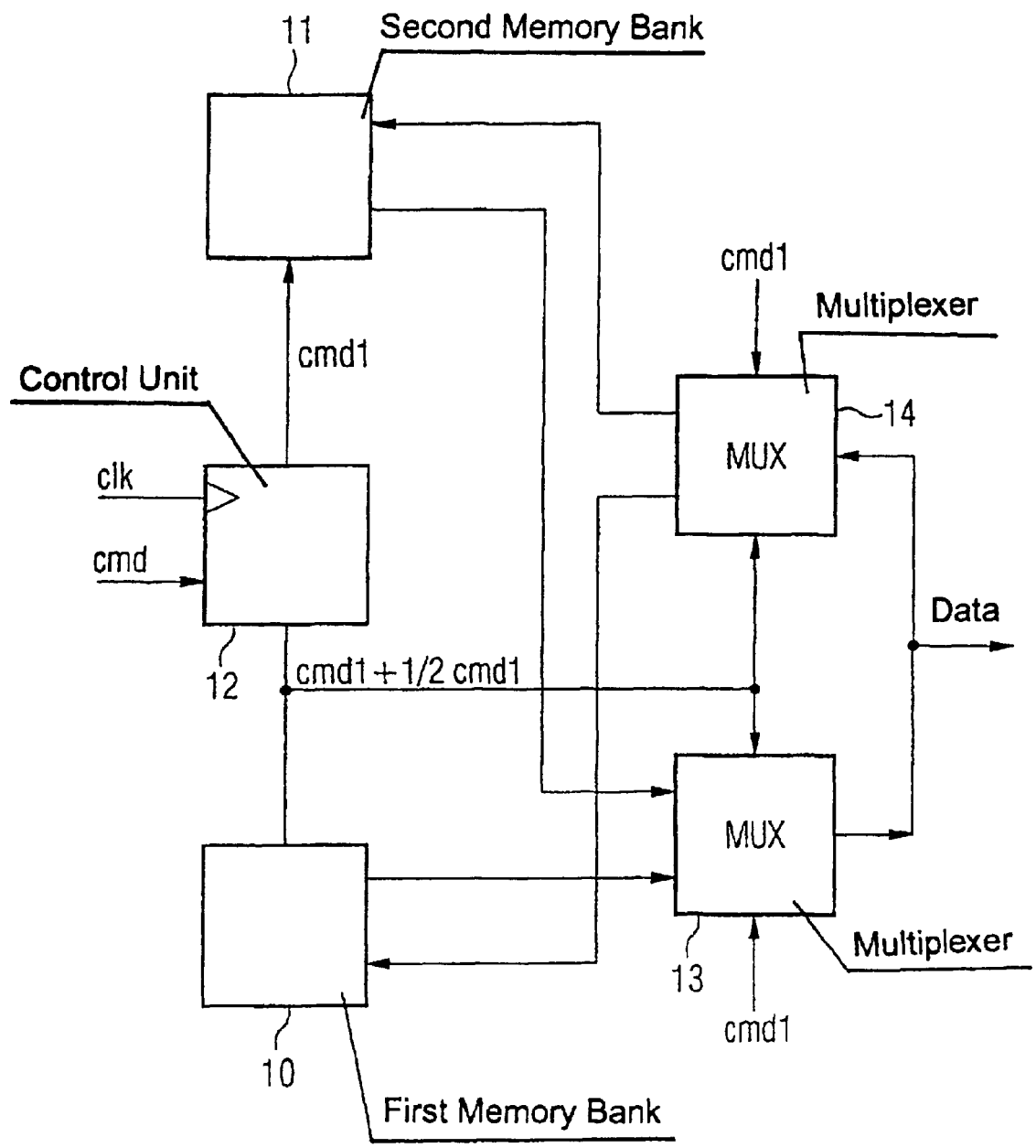

US 6,804,166 B2

METHOD AND APPARATUS FOR OPERATING A SEMICONDUCTOR MEMORY AT DOUBLE DATA TRANSFER RATE

CROSS-REFERENCE TO RELATED APPLICATION

This application is a continuation of copending International Application No. PCT/EP02/02056, filed Feb. 27, 2002, which designated the United States and was not published in English.

BACKGROUND OF THE INVENTION

FIELD OF THE INVENTION

The invention relates to a method for operating a semiconductor memory at a double data transfer rate and to the semiconductor memory being operated at the double data transfer rate.

In order to operate a semiconductor memory at a double data transfer rate when reading and writing data, respectively, the respective access has hitherto been traced back to single transfer rate access (in this field of technology, the term "single data transfer rate" is also referred to as "single data rate or SDR", while the term "double data transfer rate" is also referred to as "double data rate or DDR"). That is to say, an internal access operation with double the data length is effected at a single frequency, for example, when reading.

The first half of the internal data item is then output with the rising edge of a clock signal, while the second half of the internal data item is output with the falling edge of the clock signal. The sequence is reversed when writing. The input data item is collected at the rising and falling edges of the clock signal, is combined internally to form a data item of double the length and is subsequently written internally, with double the length, to the memory bank (the array).

This conventional method for operating a semiconductor memory at a double transfer rate has the disadvantage of inhomogeneous current consumption during a read or write access operation, respectively. Moreover, it is problematic that the memory bank has to supply double the amount of data.

U.S. Pat. No. 6,016,283 discloses a method for operating a semiconductor memory at a double data transfer rate and a corresponding semiconductor memory. A data item of a predetermined length is alternately written to two input buffers on rising and falling clock edges, respectively, in order to generate a data item of double the data length at the output. In this case, the clock signal is derived from an external clock signal, and the frequency of the external clock signals is doubled by clock shifting.

SUMMARY OF THE INVENTION

It is accordingly an object of the invention to provide a method for operating a semiconductor memory at a double data transfer rate and a semiconductor memory constructed for being operated at a double data transfer rate, which overcome the above-mentioned disadvantages of the prior art apparatus and methods of this general type.

In particular, it is an object of the invention to provide a method and a semiconductor memory of the type mentioned initially, with the result that a double data transfer rate is possible in a simple manner with a homogeneous current consumption and without additionally burdening the memory banks.

In the method in question and in the corresponding semiconductor memory, the invention enables the data read access and the write access to be shared between two memory banks. A first memory bank of which is operated with a clock that is shifted by half a clock pulse with respect to the operating clock of the other, second memory bank. Partial data streams are combined at the output of the two memory banks to form a data stream with double the frequency. The clock of the second memory bank is derived from the rising edge of an external clock signal during the read access and from the falling edge of the external clock signal during the write access, while the clock of the first memory bank is derived from the falling edge of the external clock signal during the read access and from the rising edge of the external clock signal during the write access.

In other words, the method and the semiconductor memory operate with half the data length at double the frequency, whereas the prior art operates with double the data length at single frequency.

As a result of sharing the access between two banks, the method and the semiconductor memory ensure a more homogeneous distribution of current during a read or write access operation. A further advantage of the invention is that, in contrast to the prior art, a single memory bank does not have to supply double the amount of data. Finally, an advantage of the method and of the semiconductor memory is that it is possible to use the same memory bank architecture as is used for SDR or single data transfer rate.

With the foregoing and other objects in view there is also provided, in accordance with the invention, a semiconductor memory. The semiconductor memory includes a first memory bank having an output for providing a partial data stream and a second memory bank having an output for providing a partial data stream. The semiconductor memory also includes a clock control unit and a multiplexer apparatus for sharing data read access and data write access between the first memory bank and the second memory bank. The partial data stream provided by the output of the first memory bank and the partial data stream provided by the output of the second memory bank are combined to form a data stream with a doubled frequency. The clock control unit is configured for obtaining an external clock signal. The clock control unit derives a clock for operating the first memory bank from a falling edge of the external clock signal during a read access and from a rising edge of the external clock signal during a write access. The clock control unit derives a clock for operating the second memory bank from the rising edge of the external clock signal during the read access and from the falling edge of the external clock signal during the write access. The clock for operating the first memory bank is shifted by half a clock pulse with respect to the clock for operating the second memory bank.

In accordance with an added feature of the invention, the multiplexer apparatus is constructed from a first multiplexer for combining the two partial data streams from the two memory banks to form the data stream during the read access, and a second multiplexer for dividing the data stream into the two partial data streams for the two memory banks during the write access. The two multiplexers are clocked by the clock signals of the two memory banks.

Other features which are considered as characteristic for the invention are set forth in the appended claims.

Although the invention is illustrated and described herein as embodied in a method for operating a semiconductor memory at a double data transfer rate and a corresponding semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a block diagram of a preferred embodiment of a circuit for carrying out the method.

DESCRIPTION OF THE PREFERRED EMBODIMENTS

Referring now to the single FIGURE of the drawing in detail, there is shown, a semiconductor memory. Two memory banks of the semiconductor memory are illustrated in the figure and are denoted by the reference numerals 10 and 11. The inventive concept is based on effecting the data read access and the write access in such a manner that it is shared between these two memory banks 10 and 11. In this case, the first memory bank 10 is operated with a clock that is shifted by half a clock pulse with respect to the operating clock of the other, the second memory bank 11, and the partial data streams are combined at the output of the two memory banks 10, 11 to form a data stream with double the frequency.

A clock control unit 12 is provided for the purpose of controlling the two memory banks 10, 11. An external signal cmd and an external clock signal clk are applied to the clock control unit. The clock control unit 12 uses these input signals to obtain the clock signal cmd1 for the second memory bank 11 and the clock signal cmd1 plus (½)*cmd1.

A first multiplexer 13 is used for combining the partial data streams at the output of the memory banks 10 and 11. A second multiplexer 14 is used for dividing the input data stream into two partial streams.

The partial data streams from the memory banks 10 and 11 are applied to the multiplexer 13. The clock signal cmd1 for the second memory bank and the clock signal cmd1+½cmd1 for the first memory bank 10 are also applied to the first multiplexer 13.

The input data are applied to an input of the second multiplexer 14 for the purpose of the write access. The clock signal cmd1 for the second memory bank 11 and also the clock signal cmd1+½cmd1 for the first memory bank 10 are likewise applied to the second multiplexer 14. Synchronization signals which have been applied to the first memory bank 10 and the second memory bank 11 are available at the output of the second multiplexer 14.

The following is achieved by the circuit explained above: During a write access operation, which is effected in such a manner that it is shared between the two memory banks 10 and 11, the first memory bank operates in response to the falling edge of the external clock signal clk, while the second memory bank operates in response to the rising edge of the external clock signal clk. During the read access, the partial data streams which are available at the output of the data banks 10 and 11 are combined by the multiplexer 13, under the control of the clock control unit 12 and the multiplexer 14, using the internal clock signals to form a data stream of half the original data length and with double the frequency.

For the sake of simplicity, the invention has been explained above for a double data transfer rate. However, the inventive idea is not restricted thereto. Rather, the inventive concept may also be applied to a data transfer rate of n (n=2, 4, 8 etc.), with the data read and write access being shared accordingly between a number n of memory banks.

We claim:

1. A method for operating a semiconductor memory, which comprises:

sharing a data read access and a data write access between a first memory bank and a second memory bank;

combining a partial data stream obtained from an output of the first memory bank and a partial data stream obtained from an output of the second memory bank to form a data stream with a doubled frequency;

operating the first memory bank with a clock being shifted by half of a clock pulse with respect to a clock of the second memory bank;

deriving the clock of the first memory bank from a falling edge of an external clock signal during the read access and from a rising edge of the external clock signal during a write access; and deriving the clock of the second memory bank from the rising edge of the external clock signal during the read access and from the falling edge of the external clock signal during the write access.

2. A semiconductor memory, comprising:

a first memory bank having an output for providing a partial data stream;

a second memory bank having an output for providing a partial data stream;

a clock control unit; and a multiplexer apparatus for sharing a data read access and a data write access between said first memory bank and said second memory bank;

said partial data stream provided by said output of said first memory bank and said partial data stream provided by said output of said second memory bank being combined to form a data stream with a doubled frequency;

said clock control unit configured for obtaining an external clock signal;

said clock control unit deriving a clock for operating said first memory bank from a falling edge of said external clock signal during a read access and from a rising edge of said external clock signal during a write access;

said clock control unit deriving a clock for operating said second memory bank from said rising edge of said external clock signal during said read access and from said falling edge of said external clock signal during said write access; and said clock for operating said first memory bank being shifted by half a clock pulse with respect to said clock for operating said second memory bank.

3. The semiconductor memory according to claim 2, wherein:

said multiplexer apparatus includes a first multiplexer for, during said read access, combining said partial data stream provided by said output of said first memory bank and said partial data stream provided by said output of said second memory bank to form said data stream with said doubled frequency;

said multiplexer apparatus includes a second multiplexer for, during said write access, dividing an input data stream into a partial data stream to be written into said first memory bank and a partial data stream to be written into said second data bank; and said first multiplexer and said second multiplexer are clocked by said clock for operating said first memory bank and by said clock for operating said second memory bank.

* * * * *